US007256995B2

(12) United States Patent
Wrycraft et al.

(10) Patent No.: US 7,256,995 B2
(45) Date of Patent: Aug. 14, 2007

(54) ELECTRONICS MODULE

(75) Inventors: Sean Conor Wrycraft, Harrow (GB); Brian Benstead, Farnham (GB)

(73) Assignee: Sun Microsystems, Inc., Santa Clara, CA (US)

( * ) Notice: Subject to any disclaimer, the term of this patent is extended or adjusted under 35 U.S.C. 154(b) by 307 days.

(21) Appl. No.: 10/452,816

(22) Filed: Jun. 2, 2003

(65) Prior Publication Data

US 2004/0032722 A1 Feb. 19, 2004

(30) Foreign Application Priority Data

Jun. 10, 2002 (GB) ................................ 0213251.2

(51) Int. Cl.
*H05K 7/20* (2006.01)
(52) U.S. Cl. ........................................ 361/695
(58) Field of Classification Search ............... 174/52.1, 174/50; 361/683, 695, 724, 730, 752, 816, 361/797
See application file for complete search history.

(56) References Cited

U.S. PATENT DOCUMENTS

| | | |
|---|---|---|
| 4,623,752 A | 11/1986 | Steen et al. |
| 4,820,885 A | 4/1989 | Lindsay |
| 4,864,076 A | 9/1989 | Stickney |
| 4,866,213 A | 9/1989 | Lindsay |
| 5,001,297 A | 3/1991 | Peregrim et al. |
| 5,107,070 A | 4/1992 | Benn, Sr. et al. |
| 5,142,101 A | 8/1992 | Matsuzaki et al. |
| 5,162,980 A | 11/1992 | Morgan et al. |
| 5,195,022 A | 3/1993 | Hoppal et al. |
| 5,231,246 A | 7/1993 | Benson et al. |
| 5,357,404 A | 10/1994 | Bright et al. |
| 5,523,527 A | 6/1996 | Mann et al. |
| 5,524,908 A | 6/1996 | Reis |
| 5,535,099 A | 7/1996 | McCarthy et al. |
| 5,562,410 A | 10/1996 | Sachs et al. |
| 5,566,052 A | 10/1996 | Hughes |

(Continued)

FOREIGN PATENT DOCUMENTS

DE 8315641.0 5/1983

(Continued)

OTHER PUBLICATIONS

International search report application No. GB0213251.2 mailed Oct. 25, 2002.

(Continued)

*Primary Examiner*—Tuan Dinh
*Assistant Examiner*—Ivan Carpio
(74) *Attorney, Agent, or Firm*—Meyertons Hood Kivlin Kowert & Goetzel, P.C.; B. Noël Kivlin

(57) ABSTRACT

An electronics module comprises a housing; and a plurality of electronic and electrical components for example fans. The module includes electromagnetic shielding for example perforated panels side walls etc. that is associated with the housing and/or the electronic components, and which provides a Faraday cage for the electronic components. The shielding is constructed so that one or more of the components can be removed from the module while the module is in operation substantially without affecting the integrity of the Faraday cage. The module enables certain components thereof to be replaced without adding to the downtime of the system or increasing electromagnetic interference.

20 Claims, 7 Drawing Sheets

U.S. PATENT DOCUMENTS

| | | | |
|---|---|---|---|
| 5,748,455 A | 5/1998 | Phillips et al. | |
| 5,774,330 A | 6/1998 | Melton et al. | |
| 5,774,337 A | 6/1998 | Lee et al. | |
| 5,825,634 A | 10/1998 | Moorehead, Jr. | |
| 5,886,639 A * | 3/1999 | Behl et al. | 340/635 |
| 5,959,244 A | 9/1999 | Mayer | |
| 6,018,125 A | 1/2000 | Collins et al. | |
| 6,075,698 A * | 6/2000 | Hogan et al. | 361/695 |
| 6,088,231 A | 7/2000 | Fajardo | |
| 6,095,862 A | 8/2000 | Doye et al. | |
| 6,116,615 A | 9/2000 | Treham | |
| 6,137,051 A | 10/2000 | Bundza | |
| 6,140,577 A | 10/2000 | Rapaich et al. | |
| 6,147,300 A | 11/2000 | Li et al. | |
| 6,157,534 A * | 12/2000 | Gallagher et al. | 361/683 |
| 6,163,453 A | 12/2000 | Hou et al. | |
| 6,163,454 A | 12/2000 | Strickler | |
| 6,198,630 B1 | 3/2001 | Cromwell | |
| 6,201,182 B1 | 3/2001 | Sosnowski | |
| 6,219,239 B1 | 4/2001 | Mellberg et al. | |
| 6,225,555 B1 | 5/2001 | Sosnowski | |
| 6,239,359 B1 | 5/2001 | Lilienthal, II et al. | |
| 6,252,160 B1 | 6/2001 | Chang et al. | |
| 6,252,313 B1 | 6/2001 | Zhang et al. | |
| 6,259,609 B1 | 7/2001 | Kurz | |
| 6,269,863 B1 | 8/2001 | Wyler | |
| 6,278,617 B1 | 8/2001 | Yang et al. | |
| 6,288,330 B1 | 9/2001 | Chen | |
| 6,320,120 B1 | 11/2001 | Van Haaster | |
| 6,320,121 B1 | 11/2001 | Honeycutt et al. | |
| 6,324,074 B1 | 11/2001 | Lunden | |
| 6,339,536 B1 | 1/2002 | Buican | |
| 6,362,477 B1 | 3/2002 | Sowerby et al. | |
| 6,362,977 B1 | 3/2002 | Tucker | |
| 6,406,257 B1 * | 6/2002 | Houdek | 415/213.1 |
| 6,444,900 B1 | 9/2002 | Casey | |
| 6,534,706 B1 | 3/2003 | Rapp et al. | |
| 6,646,877 B2 * | 11/2003 | Willers et al. | 361/695 |
| 6,816,590 B2 * | 11/2004 | Pike et al. | 379/329 |
| 6,878,874 B2 * | 4/2005 | Osborn et al. | 174/50 |

FOREIGN PATENT DOCUMENTS

| | | |
|---|---|---|
| DE | 29509034 | 5/1995 |
| DE | 19821522 | 5/1998 |
| EP | 0520173 | 5/1992 |
| EP | 0655882 | 11/1994 |
| EP | 0843512 | 5/1998 |

OTHER PUBLICATIONS

"Intel Pentium 4 Processor in the 423-Pin Package EMI Guideline", Intel Corp., Oct. 2000, pp. 1-9.

"Radio Frequency Interference Seal", IBM Technical Disclosure Bulletin, vol. 33, No. 5, IBM Corp., Armonk NY, Oct. 1990.

"Mechanical Enabling Efforts", Intel Developer Forum, Intel Corp., Fall 2000.

* cited by examiner

ELECTRONICS MODULE

BACKGROUND OF THE INVENTION

The present invention relates to electronics assemblies, and is primarily concerned with racked assemblies. Many such assemblies will be located in racks for housing in, for example, nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise housing, for example in the form of a supporting chassis that houses a motherboard or backplane and a number of daughterboards or module cards that extend in planes generally perpendicular to the plane of the motherboard. Other components may be included, such as power supply units, hard disc drives, tape drives, ROM drives etc., with the result that the space available for provision of all the services in the enclosure is severely limited, and no internal space of the enclosure can be wasted.

One form of computer that may be used in such an assembly is called a "high RAS computer" that is to say, a computer that needs to provide a high degree of reliability, availability and serviceability. Such computers need to maximise the length of time during which the computer is operational. The computer may need to withstand a considerable degree of vibration, whether to particular office conditions or because of seismic activity, and so needs to exhibit a high degree of ruggedness. Furthermore, any periods during which the computer is down for example due to repair or maintenance should be minimised, which requires reducing the time taken to remove and reinstall any components of the system.

SUMMARY OF THE INVENTION

According to one aspect of the invention, there is provided an electronics module which comprises:
 (i) a housing; and
 (ii) a plurality of electronic and electrical components;
the module including electromagnetic shielding that is associated with the housing and/or the electronic components, and which provides a Faraday cage for the electronic components, the shielding being constructed so that one or more of the components can be removed from the module while the module is in operation substantially without affecting the integrity of the Faraday cage.

Such a module has the advantage that certain components can be removed and replaced, for example during routine service calls or for repair of any failed component, without the need to shut down the equipment and without the operation causing any significant increase in electromagnetic interference of the equipment or any significant increase in interference of any neighbouring equipment by the module.

Normally the module will include not only electronic components, but also electrical components, that is to say, components that have no electronic function and which are not subject to electromagnetic interference (EMI). Such electrical components that are used are generally designed not to generate significant interference, or at least to generate interference at significantly different frequencies to those employed in such equipment. The most common electrical components that are employed are fans for cooling the equipment that typically employ brushless a.c. or d.c. motors. These components may have to be replaced relatively often (that is to say, compared with other components of the module) but are not required to be located within the Faraday cage, and may be arranged on the outside of the Faraday cage. Usually more than one fan will be employed in order to provide a degree of redundancy, so that should one fan fail, the remaining fans will continue to operate and cool the module. Accordingly, the module may be designed so that a plurality of fans are arranged on a surface of the housing, and that surface, together with a corresponding surface on the other side of the frame, has shielding that is perforated (or is otherwise air-permeable) so that air can flow through the housing from one side to the other.

Thus, according to another aspect of the invention, there is provided an electronics module which comprises:
 (i) a housing;
 (ii) a plurality of electronic components;
 (iii) electromagnetic shielding that is associated with the housing and which provides a Faraday cage for the electronic components; and
 (iv) one or more fans for cooling the electronic components;

wherein the or each fan is located on the outside of the Faraday cage, and at least part of the Faraday cage is air-permeable to allow air from the or each fan to flow through the assembly.

The Faraday cage may be formed at least in part by the housing of the electronics assembly. It may also be formed in part by the components of the assembly. For example, the frame may be divided into a plurality of recesses in order to allow location of electronics components therein. These recesses may, for example, be open to the exterior of the housing and allow insertion of the components in the form of sub-modules by sliding them into the recesses. Where the frame is divided into recesses, the recesses may be separated from one another by means of the shielding so that any electronic components that are not removed will remain within the Faraday cage. The modules may, for example, be formed with metal or otherwise electrically conductive housings at least on the face thereof that forms part of the external surface of the module when the sub-module has been inserted. In such a case, the exposed face of the sub-module forms part of the Faraday cage when the module has been inserted, but once it has been removed, the recess it occupied is now on the outside of the Faraday cage.

The housing may conveniently be formed with a plurality of sub-frames, each sub-frame for example housing electronic components having different functions, and each sub-frame, or at least one of the sub-frames providing a separate Faraday cage. Thus, one sub-frame or equipment bay may house the power supplies, input/output cards, media equipment etc. while another sub-frame, or the remaining part of the housing that is outside the sub-frame, may house other electronic components, for example daughterboards or cards that are connected to a motherboard or backplane.

The shielding may include one or more apertures (larger than the perforations for air flow) in order to allow connection of different electronic components, but which do not allow removal of any component.

This design of module is especially useful for modules described in our co-pending UK patent application entitled "Electronic Circuits" filed on Jun. 10 2002, the disclosure of which is incorporated herein by reference. In such modules, both the motherboard and the daughterboards lie in planes that extend from front to back, i.e. extend from positions proximal to the user of the equipment to a position distal to the user. In such an arrangement, fans can be located on the housing so that, in operation, they blow air from the front to the back of the cabinet or vice versa. Such a horizontal air flow obviates the need for any ducting located above and below the module that would be required to cause air entering and leaving the module horizontally to be blown vertically through the interior of the module, as was the case with conventional assemblies where a vertical motherboard was located at the rear of the frame.

It would be possible to employ a vertical motherboard located at one side of the housing together with daughterboards arranged in horizontal planes on the motherboard, and to blow cooling air through the assembly from front to back. However, in order to remove the daughterboards from the frame, it would be necessary to slide them out of the side of the housing opposite to the motherboard, and such an operation may interfere with any sliders which are used to mount the module within a cabinet. Alternatively, a horizontal motherboard may be employed located at the bottom of the module, and daughterboards arranged in vertical planes extending from front to back may be used. In this way, air can be blown horizontally, and the daughterboards can be inserted and removed vertically.

According to a further aspect of the invention, there is provided a housing for an electronics module which includes a plurality of recesses into which electronic components can be inserted, and electromagnetic shielding that is associated with at least some of the recesses to provide a Faraday cage that can enclose the electronic components when inserted, the shielding being air-permeable to allow a through-flow of air for cooling the electronic components.

According to yet another aspect of the invention, there is provided a method of servicing an electronics assembly comprising a housing and a plurality of electronic and electrical components, which method comprises removing and replacing at least one of the components while the assembly is in operation, wherein the assembly includes electromagnetic shielding that is associated with the housing and/or the electronic components and which provides a Faraday cage, for the electronic components, and the shielding is constructed so that removal of the or each electrical component during the servicing method does not affect the integrity of the Faraday cage.

BRIEF DESCRIPTION OF THE DRAWINGS

Embodiments of the present invention will now be described in detail, by way of example, with reference to the accompanying drawings, in which corresponding parts are given like reference numbers. In the drawings.

DESCRIPTION OF PARTICULAR EMBODIMENTS

Figure 1:
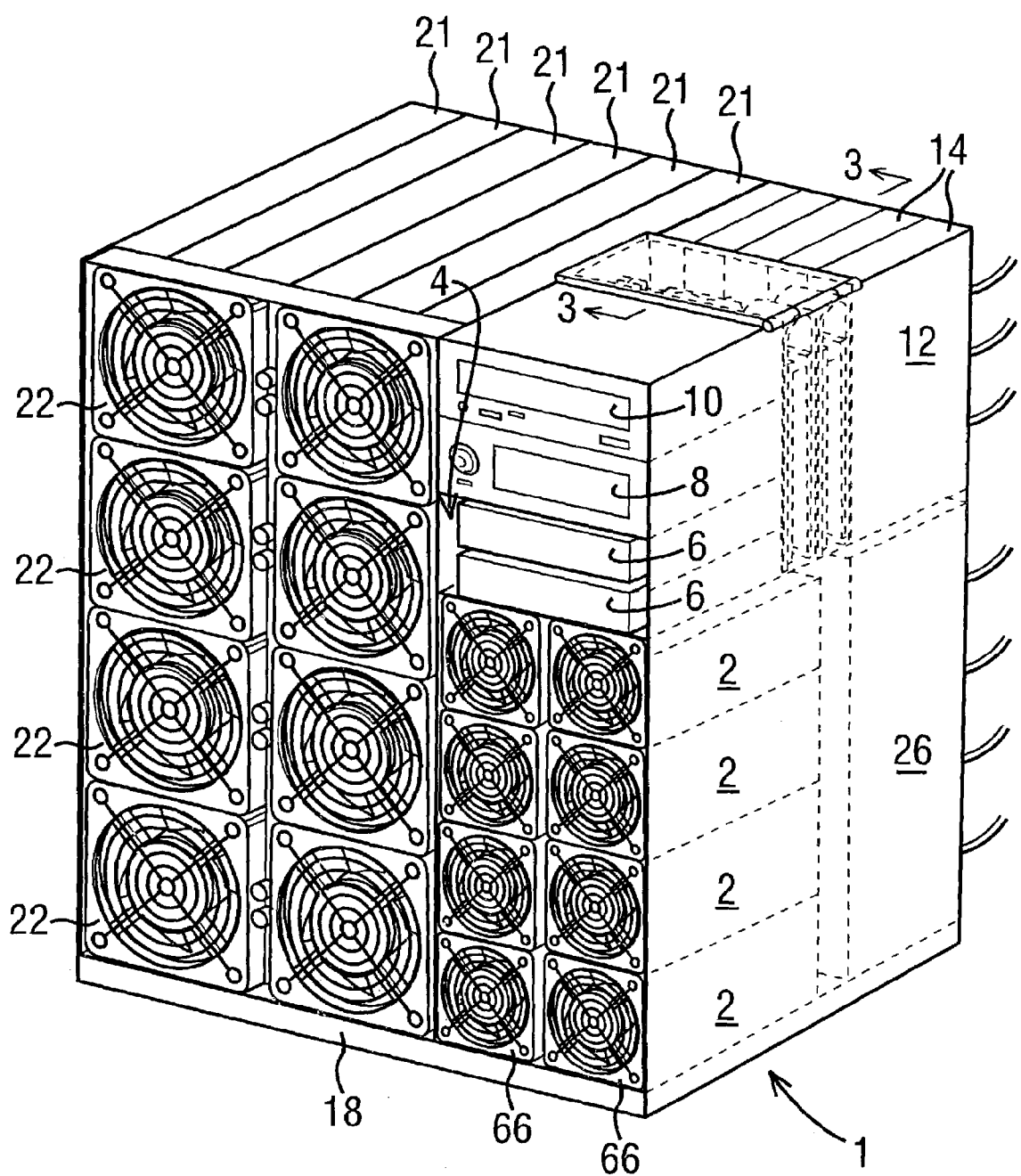
FIG. 1 is a schematic perspective view of an electronics module according to one aspect of the present invention.

Referring now to the drawings, in which like reference numerals are used to designate corresponding elements, FIG. 1 shows a module according to one embodiment of the invention that forms part of a server that may be employed for a number of services, for example as part of a local area network (LAN) or for other telecommunications purposes, and is designed as a nineteen inch rack to be located in an electronics cabinet. The assembly may be employed in a so-called "high RAS" system, that is to say, to have high reliability, availability and serviceability. As such, it is intended that the system will operated with the minimum amount of down time, and so a degree of redundancy is incorporated so that the system will continue to operate even when certain components have failed. In addition, servicing of the equipment should take as short a time as possible, so that, where practical, components that need to be replaced should simply be disconnected and removed, and a replacement component inserted. Furthermore, the assembly should be able to operate during seismic activity to telecoms standards.

The module comprises a housing or chassis 1 in which the various components are located. The housing contains a number of power supply units 2 for receiving a.c. mains power or supply d.c. power from a power inlet connection module 26 and converting it to an appropriate d.c. voltage for the rest of the system. The module also includes a media area 4 that contains hard disc drives 6, a tape drive 8 and a CD-ROM or digital video disc (digital versatile disc) (DVD) drive 10, and a part 12 that contains a number of I/O cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc.

Figure 2:
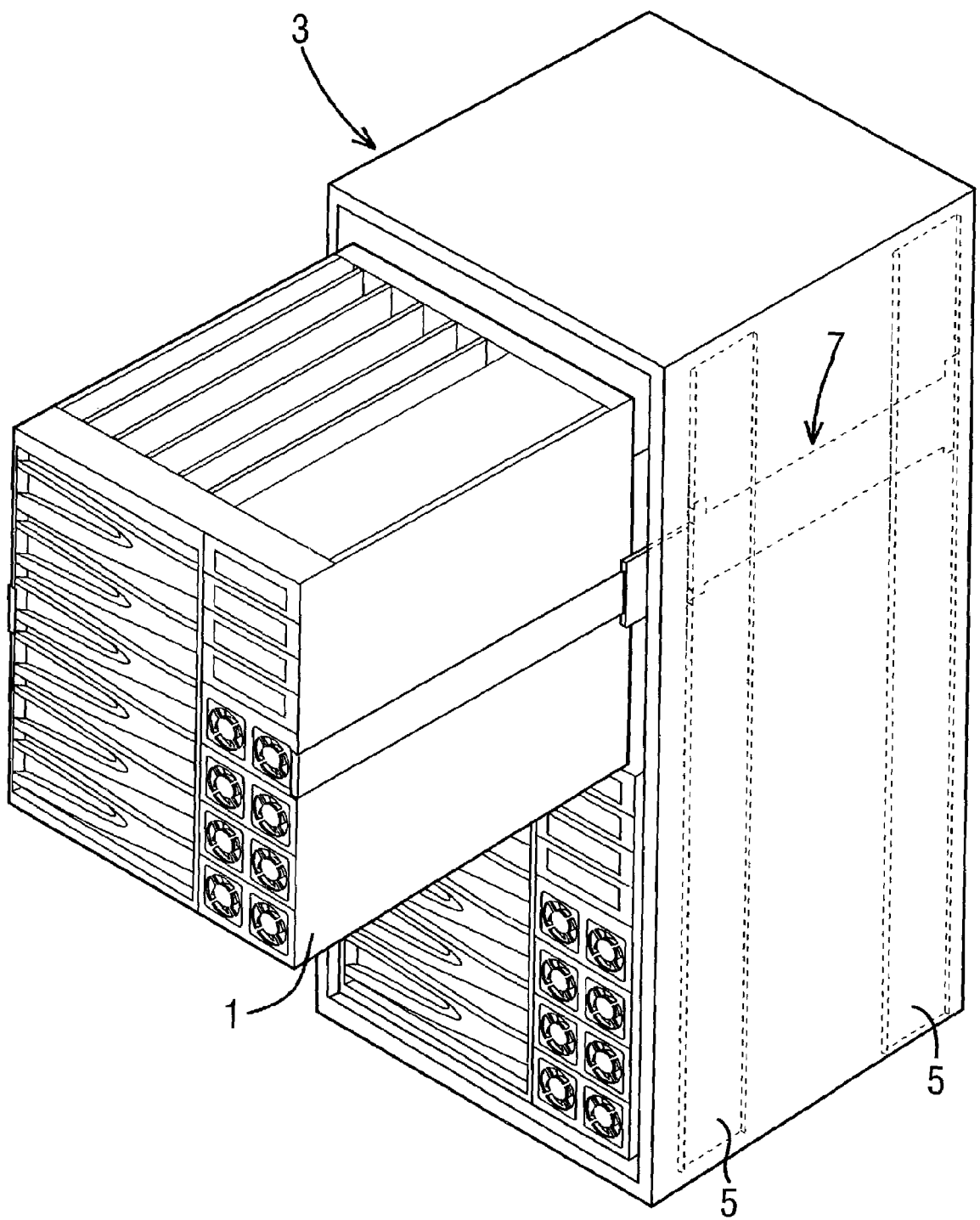
FIG. 2 is a schematic perspective view of a cabinet that contains a rack and a plurality of modules as shown in FIG. 1.

The module may be located within a cabinet 3 as shown in FIG. 2, in which another module is also located to form an electronics system. Each module may be supported within the cabinet 3 by means of a rack which comprises a number of supporting posts 5 and a telescopic slider mechanism 7 that allows each module 1 to be pulled out from the front of the cabinet, for example for servicing, and then pushed back into the cabinet.

Figure 3:
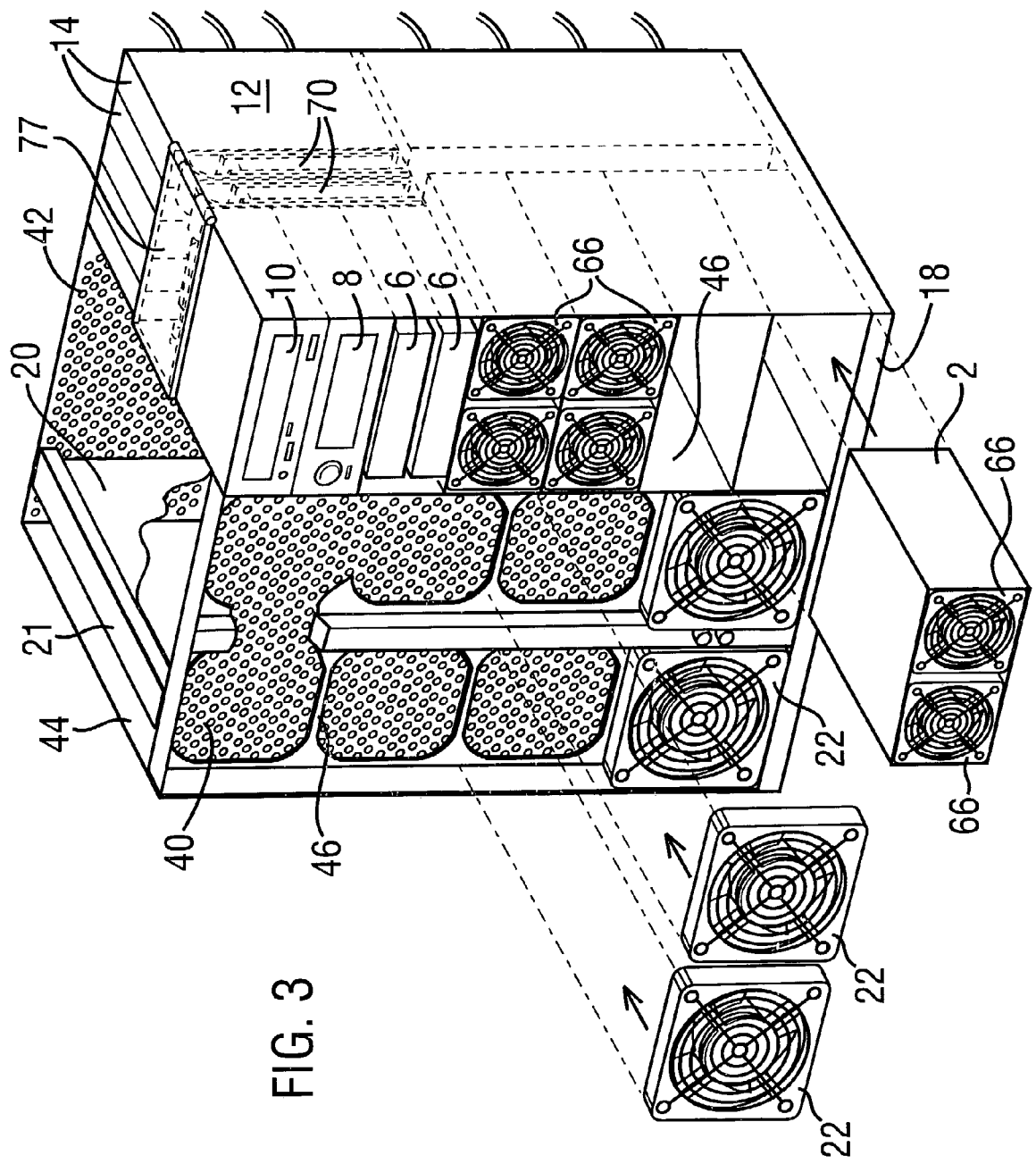
FIG. 3 is a schematic perspective view of the module shown in FIG. 1 with parts thereof removed.

FIG. 3 shows the same module as shown in FIG. 1 but with certain parts removed for the sake of clarity. The daughterboards 20 are located inside a recess in the housing that is formed between a perforated panel 40 that is located on the front face of the housing 1, a perforated panel 42 at the rear surface of the housing, a side panel 44 at the left side of the housing (as viewed from the front) and an internal partition 46 of the housing. The daughterboards are therefore housed within a Faraday cage that is formed by the perforated panels 40 and 42, the left side panel 44 of the frame the internal partition 46 and the holder 18 of the motherboard. The upper edge region of each daughterboard is slightly wider than the rest of the daughterboard and has a horizontal top surface 21, so that when all the daughterboards 20 have been lowered into place the top surface 21 of each daughterboard is in contact with the corresponding surface of the adjacent daughterboards or with the top edge of the side panel 44 and the internal partition 46 along the length of the edge. In addition, a gasket may be provided along the length of the top edge of the daughterboard on either side thereof in order to ensure that the contact resistance at the adjacent top surfaces of the daughterboards is reduced and the shielding against EMI is increased. In this way, the top surface 21 of each daughterboard forms the upper surface of the Faraday cage.

Alternatively an electrically conductive lid may be provided for the module which may be closed on the housing to complete the Faraday cage.

Figure 4:
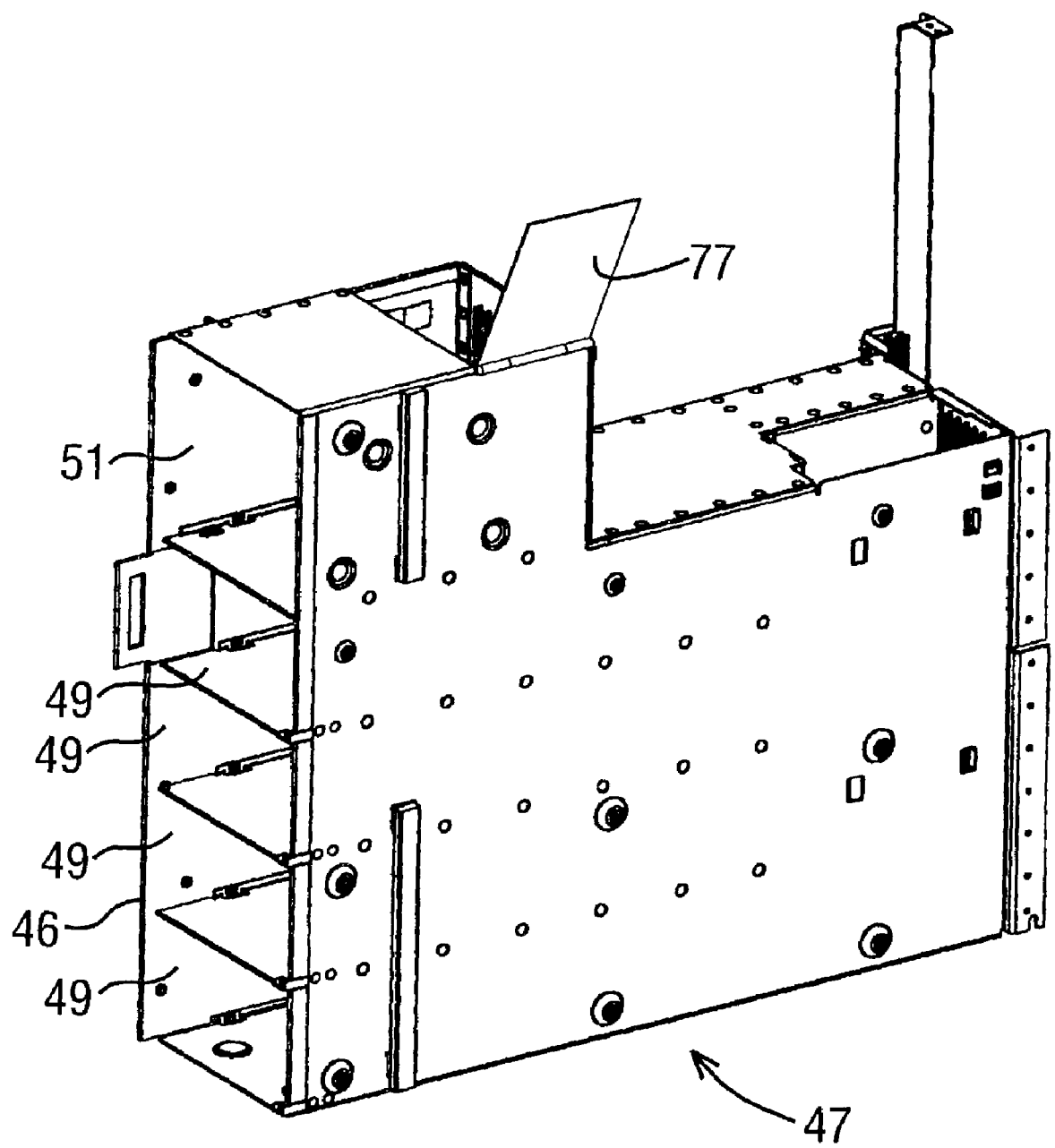
FIG. 4 is a perspective view of a sub-frame employed in the module shown in FIG. 1.

The internal partition 46 may form part of a sub-frame 47 as shown in FIG. 4. This sub-frame 47 may, but need not, itself form a Faraday cage, and if so, the level of screening may be different than that provided by the Faraday cage in which the daughterboards are located, This sub-frame has recesses 49 in which the power supply units 2 may be located, and a recess 51 in which a holder for the hard drives 6, tape drive 8 and DVD drive 10 may be located.

Eight fans 22 are provided in an array at the front of the frame in order to blow air through the module between the daughterboards. Other numbers of fans, for example four or six fans, may be employed, provided that some redundancy is maintained so that an air flow will be maintained should any fan fail. Each fan is driven by a low voltage brushless d.c. motor that is mounted in a block to form a fan module 28.

Figure 5:
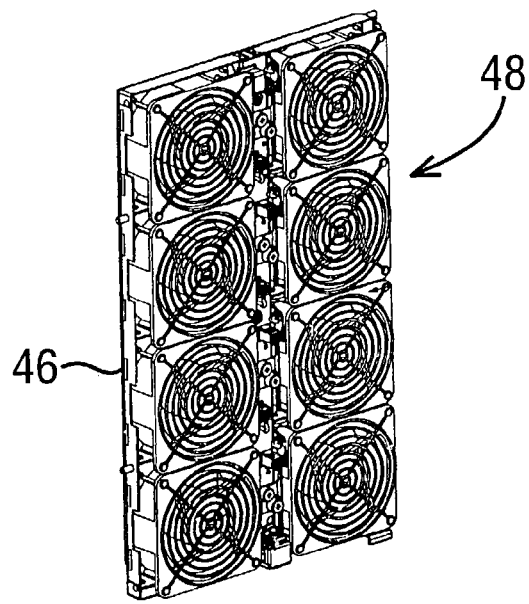
FIG. 5 is a perspective view of a panel of cooling fans that is arranged on the front of the housing.
Figure 6:
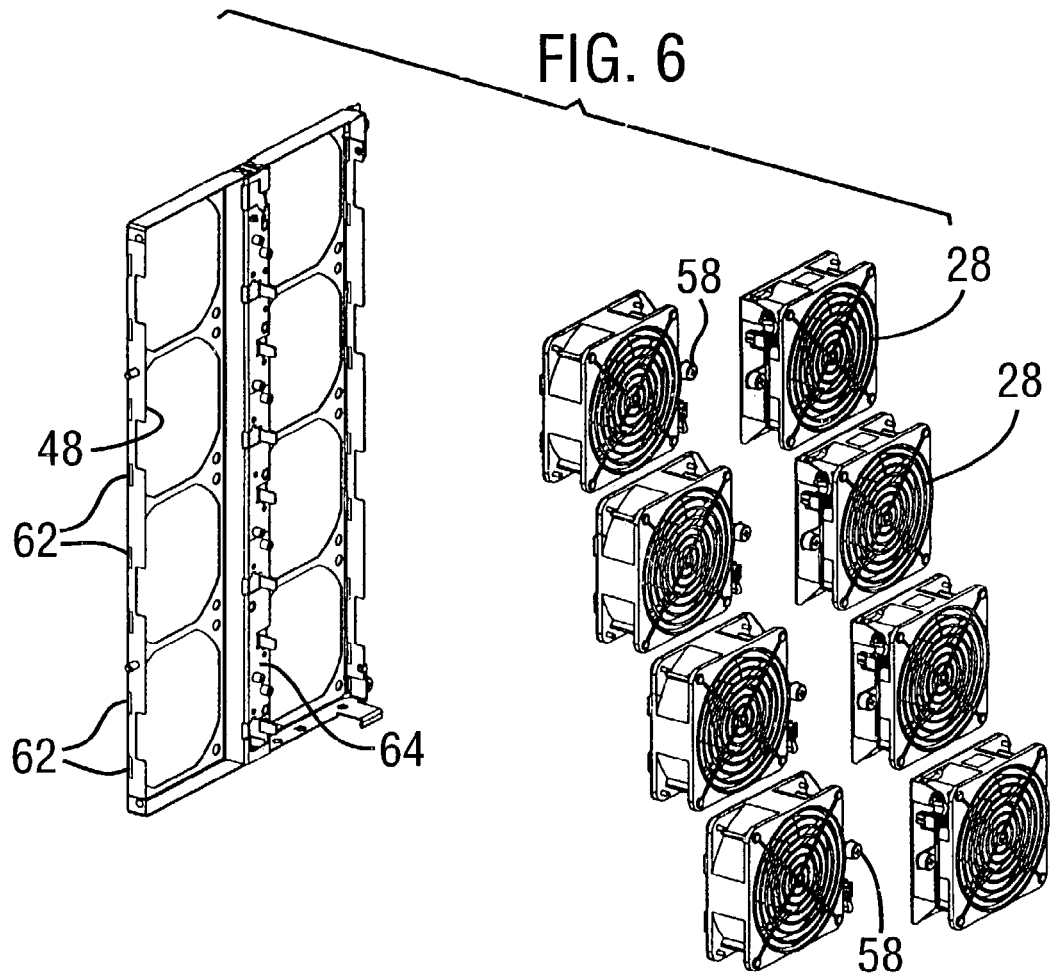
FIG. 6 is an exploded view of the panel shown in FIG. 5.
Figure 7:
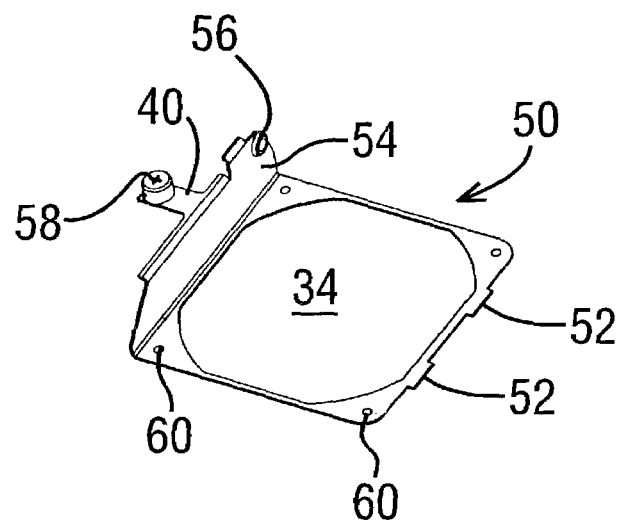
FIG. 7 is a view of a device for attaching the fans to the panel.

As shown in FIGS. 5 and 6, the fans 22 are housed in a holder 46 to form a panel 48, the holder being formed from a pressed aluminium zinc plated steel sheet that is divided into eight compartments, each having an aperture for allowing flow of air from the fan module. The fans are located on the holder 46 so that individual fans can be released from the holder and replaced if necessary, without removing the holder from the front of the frame. Each fan module may, for example, include a device 50 shown in FIG. 6 for retaining the module in the holder 46. The device has a pair of tabs 52 on one side and a flange 54 on the side opposite the tabs 52 from which a support 56 for a captive screw 58 is located. A hole 60 is located in each corner of the device for receiving a screw or other fastener to attach the device to the block 26 of the fan module.

The fan modules are inserted into the holder 30 so that the tabs 52 engage recesses 62 in the outer flange 48 of the holder and the captive screws 42 are aligned along a central line 64 of the holder. The central line 64 also includes electrical connectors to enable the fans 22 to be connected to a source of power once they are inserted in position.

If any of the fans 22 needs to be replaced during servicing, it can simply be removed by releasing the captive screw 58, and swinging the module 28 out, and a replacement module can be inserted. This operation can be performed without powering the assembly down if desired, and without compromising the integrity of the Faraday cage at all.

In addition to the fans 22, further fans 66 are provided on one of the faces of the power supply units 2. These fans blow air through the power supply 2, though a perforated bulkhead (not shown) between the power supply units 2 and the power inlet connection module 26. The fans 66 are not, in fact, separate items, but instead form part of the power supply units 2, so that if any of these fans fail, or any other part of a power supply unit fails, the fans 66 and the unit 2 are removed and replaced as one piece.

Figure 8:
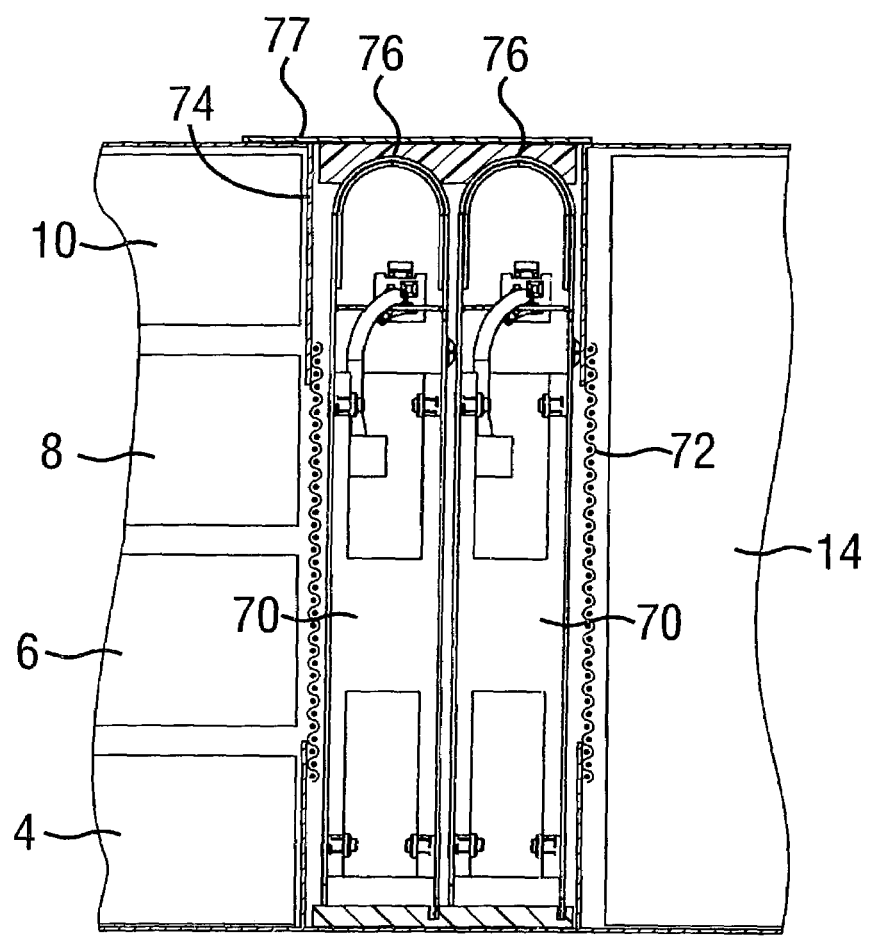
FIG. 8 is a section through the module along the line 3-3 of FIG. 1.
Figure 9:
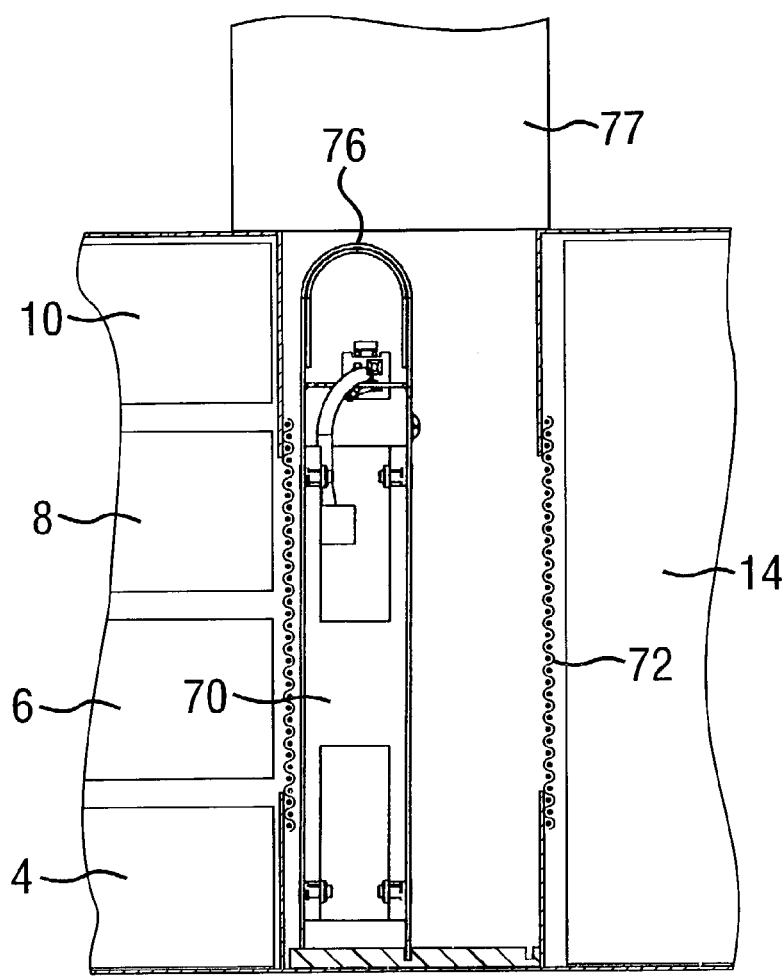
FIG. 9 is a section through the module corresponding to FIG. 7 but with one fan removed.

Two further fans 70 are provided as shown in FIGS. 8 and 9. These fans are positioned in a recess that is located in the upper part of the housing between the media area 4 and the part 12 containing the I/O cards 14. The recess is in the form of a short length of duct that is walled off from the remaining internal volumes of the housing for example by means of perforated panels 72 and 74 so that it effectively functions externally to the system, that is to say, it is sealed from the interior of the housing against EMI emissions and the internal volumes are protected against ESD. The cooling fans 70 are arranged in series so that cooling air passes through both fans in series in order to provide a degree of redundancy. Should one fan 70 malfunction, cooling air will continue to be provided by the other fan until the malfunctioning fan is replaced.

Figure 10:
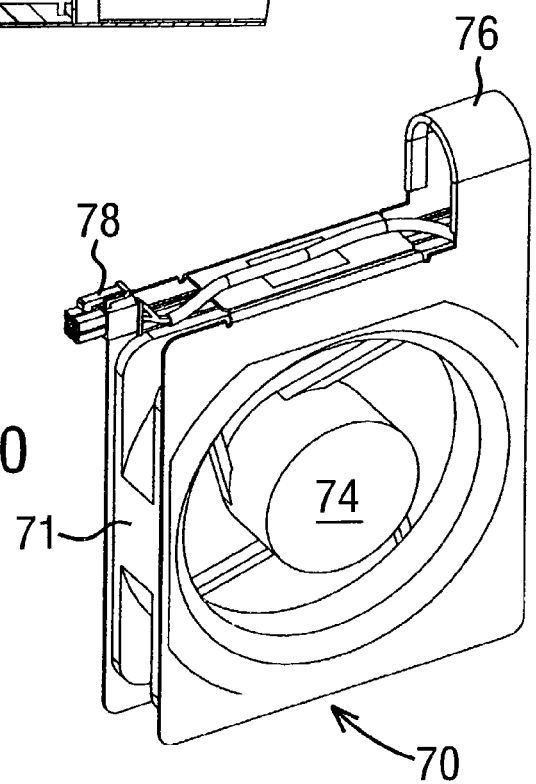
FIG. 10 is a perspective view of one of the fans.

One fan module 70 is shown in FIG. 10. The fan module comprises a generally flat fan unit 71 of substantially square major surfaces, which includes a fan 74 that is powered by a brushless d.c. motor, and blows air in a direction normal to the major surfaces. The major surfaces of the fan module are formed from a sheet of metal that is folded over the fan module, and which forms a loop 76 to enable a service engineer quickly to lift the fan module out of the recess by lifting the loop with his finger, after having lifted the access-cover 77 and disconnected connector 78 so that only a single fan is located in the recess as shown in FIG. 8. The removed fan 70 can then be replaced and reconnected in a matter of seconds without disturbing the operation of the assembly. During this operation, the I/O cards 14 in the area 12 will still be retained within a Faraday cage that is formed partly by the panel 72, partly by the wall of the frame and partly by the upper edges of the modules forming the I/O cards 14.

Thus, according to this aspect of the invention, it is possible to provide an electronics assembly with both air cooling and with protection from electromagnetic interference, without the need to power the assembly down in order to change any of the fans, and without compromising the effectiveness of the Faraday cage during replacement of the fans.

The invention is not limited to the removal and replacement of electrical components such as fans without reducing the level of EMI screening by the Faraday cage. Some electronic components may be replaced in this way. For example, it is possible to remove and replace the hard disc drives 6 by removing them from the front of the assembly, while the assembly is still running. During this operation, those parts of the assembly such as the daughterboards 20 will still be shielded as will the I/O cards 14.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

The invention claimed is:

1. An electronics module which comprises:
   a housing;
   a plurality of electronic components;
   a plurality of fans, wherein at least a subset of the plurality of fans is operable to cool at least a subset of the plurality of electronic components;
   electromagnetic shielding that is at least partially associated with the housing and which provides a Faraday cage for the at least a subset of the plurality of electronic components;
   wherein the at least a subset of the plurality of fans are located outside of the Faraday cage, and at least part of the Faraday cage is air-permeable to allow air from the at least a subset of the plurality of fans to flow through the module;
   wherein the shielding is constructed so that a fan of the at least a subset of the plurality of fans can be removed from the module, without removing any of the at least a subset of the plurality of electronic components the at least a subset of the plurality of fans is cooling, while the module is in operation substantially without affecting integrity of the Faraday cage for any of the at least a subset of the plurality of electronic components the at least a subset of the plurality of fans is cooling;
   wherein the fan of the at least a subset of the plurality of fans is operable to be coupled to the housing through a tab on one of the fan and the housing engaging a slot on the other of the fan and the housing;
   wherein the fan is further operable to be coupled to the housing through a separate fastener; and
   wherein the fan is operable to be removed from the housing by releasing the separate fastener and swinging the fan outward to disengage the tab/slot engagement between the fan and the housing.

2. The electronics module of claim 1, further comprising an electrically conductive lid operable to be opened and closed on the housing to form part of the Faraday cage;
   wherein at least one other fan of the at least a subset of the plurality of fans is operable to be inserted into the housing through an opening formed in the housing when the lid is opened.

3. The electronics module of claim 2, wherein the at least one other fan comprises a loop that is accessible for lowering and lifting the fan in/out of the opening.

4. The electronics module of claim 1, wherein the shielding is constructed so that the fan of the at least a subset of the plurality of fans can be removed from the module, without even partially removing any of the at least a subset of the plurality of electronic components the at least a subset of the plurality of fans is cooling, while the module is in operation substantially without affecting integrity of the Faraday cage for any of the at least a subset of the plurality of electronic components the at least a subset of the plurality of fans is cooling.

5. The electronics module of claim 1, wherein the plurality of fans are located outside the Faraday cage and abut the Faraday cage.

6. The electronics module of claim 1, wherein the at least a subset of the plurality of fans comprises at least two fans that provide redundant cooling to the at least a subset of the plurality of electronic components such that if a fan of the at least two fans fails, at least one other fan of the at least two fans continues to provide cooling to the at least a subset of the plurality of electronic components.

7. The electronics module of claim 1, further comprising:
   a daughterboard configured to be removably secured in the housing;
   wherein the daughterboard comprises a gasket along a length of the daughterboard; and
   wherein the gasket is operable to form a part of the Faraday cage when the daughterboard is secured into the housing.

8. An electronics module which comprises:
   a housing;
   an electrically conductive lid coupled to the housing;
   a plurality of electronic components coupled to the housing;
   a plurality of electrical components, wherein at least a subset of the plurality of the electrical components are associated with at least a subset of the plurality of electronic components, wherein the electronic components generate more electromagnetic interference than the electrical components;
   electromagnetic shielding that is at least partially associated with the housing and provides a Faraday cage for the at least a subset of the plurality of electronic components;
   wherein the shielding is constructed so that one or more of the at least a subset of the plurality of electrical components can be removed from the module, without removing or powering down the electronic component of the plurality of electronic components that is associated with the one or more of the at least a subset of the plurality of electrical components being removed, while the module is in operation substantially without affecting integrity of the Faraday cage for the at least a subset of the plurality of electronic components and
   wherein the electrically conductive lid is operable to be opened and closed on the housing to form part of the Faraday cage.

9. The electronics module of claim 8, wherein the shielding is constructed so that one or more of the at least a subset of the plurality of electrical components can be removed from the module, without even partially removing or powering down the electronic component of the at least a subset of the plurality of electronic components that is associated with the one or more of the at least a subset of the plurality of electrical components being removed, while the module is in operation substantially without affecting integrity of the Faraday cage for the at least a subset of the plurality of electronic components.

10. The electronics module of claim 8, wherein at least one of the at least a subset of the plurality of electrical components is a fan.

11. The electronics module of claim 8,
    wherein the at least a subset of the plurality of electrical components are arranged on a surface of the housing; and
    wherein the at least a subset of the plurality of electrical components includes a plurality of fans and wherein the surface of the housing, together with an opposing surface of the housing, has shielding that is perforated to allow air to flow through the housing due to the fans.

12. The electronics module of claim 8,
    wherein at least one of the electrical components of the at least a subset of the plurality of electrical components is a fan; and
    wherein the fan is operable to be inserted into the housing through an opening formed in the housing when the lid is opened.

13. The electronics module of claim 8, wherein the subset of the plurality of electrical components are operable to be secured to a single holder.

14. The electronics module of claim 13,
wherein at least one electrical component of the subset is operable to be coupled to the holder through a tab on one of the electrical component and the holder engaging a slot on the other of the electrical component and the holder;
wherein the at least one electrical component is further operable to be coupled to the holder through a separate fastener; and
wherein the at least one electrical component is operable to be removed from the holder by releasing the separate fastener and swinging the electrical component outward to disengage the tab/slot engagement between the fan and the housing.

15. The electronics module of claim 8, wherein the electrically conductive lid is substantially permanently coupled to the housing, along at least one side of the electrically conductive lid, through a hinge.

16. A method of servicing an electronics assembly comprising a housing and a plurality of electronic and electrical components, comprising:
removing and replacing at least one of the electrical components while the assembly is in operation;
wherein at least a subset of the plurality of the electrical components are associated with at least a subset of the plurality of electronic components;
wherein the assembly includes electromagnetic shielding that is at least partially associated with the housing and which provides a Faraday cage for the at least a subset of the plurality of electronic components;
wherein the shielding is constructed so that one or more of the electrical components of the at least a subset of the plurality of electrical components can be removed from the module, without removing or powering down the electronic component of the plurality of electronic components that is associated with the one or more of the electrical components being removed, while the module is in operation substantially without affecting integrity of the Faraday cage for the at least a subset of the plurality of electronic components;
wherein an electrically conductive lid, coupled to the housing, is operable to be opened and closed on the housing to form part of the Faraday cage; and
wherein the electronic components generate more electromagnetic interference than the electrical components.

17. The method of claim 16, wherein the shielding is constructed so that one or more of the electrical components of the at least a subset of the plurality of electrical components can be removed from the module, without even partially removing or powering down the electronic component of the plurality of electronic components that is associated with the one or more of the electrical components being removed, while the module is in operation substantially without affecting integrity of the Faraday cage for the at least a subset of the plurality of electronic components.

18. The method of claim 16, wherein at least one of the at least a subset of the plurality of electrical components is a fan.

19. The method of claim 16, wherein at least one of the at least a subset of the plurality of electrical components is located outside the Faraday cage and abuts the Faraday cage.

20. The method of claim 16,
wherein the at least a subset of the plurality of electrical components are arranged on a surface of the housing; and
wherein the at least a subset of the plurality of electrical components includes a plurality of fans and wherein the surface of the housing, together with an opposing surface of the housing, has shielding that is perforated to allow air to flow through the housing due to the fans.

* * * * *